(12) United States Patent
Kulkarni et al.

(10) Patent No.: US 9,137,862 B2
(45) Date of Patent: Sep. 15, 2015

(54) SLEW RATE CONTROLLED TRANSISTOR DRIVER

(71) Applicant: Texas Instruments Incorporated, Dallas, TX (US)

(72) Inventors: Sumeet Prakash Kulkarni, Westminster, CO (US); Yan Yin, Longmont, CO (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/092,689

(22) Filed: Nov. 27, 2013

(65) Prior Publication Data

US 2014/0361706 A1 Dec. 11, 2014

Related U.S. Application Data

(60) Provisional application No. 61/832,626, filed on Jun. 7, 2013.

(51) Int. Cl.
*H05B 37/02* (2006.01)
*H05B 33/08* (2006.01)
*H03K 17/00* (2006.01)

(52) U.S. Cl.
CPC ............ *H05B 33/0809* (2013.01); *H03K 17/00* (2013.01)

(58) Field of Classification Search
USPC .................................. 315/294, 299, 307, 360
See application file for complete search history.

(56) References Cited

U.S. PATENT DOCUMENTS

| 5,345,167 | A | 9/1994 | Hasegawa et al. | |
| 7,402,962 | B1 * | 7/2008 | Fong | 315/299 |
| 8,044,693 | B1 * | 10/2011 | Mannoorittathu et al. | 327/170 |
| 8,373,358 | B2 * | 2/2013 | Hsu et al. | 315/291 |
| 2010/0253228 | A1 * | 10/2010 | Hoover | 315/149 |
| 2010/0264957 | A1 * | 10/2010 | Tamaoka | 327/109 |
| 2011/0043118 | A1 * | 2/2011 | Joo et al. | 315/185 R |

FOREIGN PATENT DOCUMENTS

WO WO2009094329 7/2009
WO WO2011139624 11/2011

OTHER PUBLICATIONS

PCT Search Report mailed Oct. 16, 2014.

* cited by examiner

*Primary Examiner* — Tung X Le
(74) *Attorney, Agent, or Firm* — William B. Kempler; Frank D. Cimino

(57) ABSTRACT

A gate driver circuit providing a slew-rate controlled gate control signal while minimizing the stretching of the gate control signal relative to the input control pulse. Control logic effects two threshold voltage levels. When the gate control signal is between the two threshold voltage levels, the slew rate of the gate control signal is controlled such that the gate of the transistor being driven is driven softly. When the gate control signal is less than the first threshold voltage level or greater than the second threshold voltage level, the gate of the transistor being driven is driven hard. In one embodiment, the first and second threshold voltage levels are set such that the on/off threshold of the transistor being driven is between the two threshold voltage levels. Thus the slew rate of the gate control signal is controlled such that the gate of the transistor being driven is driven softly when the transistor being driven is transitioning from off to on, or from on to off, thereby minimizing harmonics. At all other times, the gate control signal rises and falls rapidly so as to minimize the stretching of the gate control signal relative to the input control pulse.

18 Claims, 3 Drawing Sheets

SLEW RATE CONTROLLED TRANSISTOR DRIVER

CROSS-REFERENCE TO RELATED APPLICATIONS

This application claims priority to U.S. Provisional Patent Application Ser. No. 61/832,626, filed Jun. 7, 2013, which is hereby incorporated herein by reference in its entirety.

BACKGROUND

The rapid growth of LED (light-emitting diode) lighting has led to a wide variety of integrated circuit devices to provide controlled power to LEDs. In many applications, real-time changes in LED output intensity are required. This function is commonly referred to as dimming control. One method of effecting dimming control of an LED is pulse-width modulation. Pulse-width modulation involves the commutating, or starting, stopping, and restarting, of a substantially constant LED current for short periods of time. In order to avoid a flickering effect, this start-restart cycle is performed at a frequency of about 200 Hz or faster, which makes the starting and restarting of the LED current undetectable to the human eye. The apparent brightness of the LED is determined by the time-averaged current through the LED. Thus the dimming of the LED is proportional to the duty cycle of the dimming waveform.

FIG. 1 is a circuit diagram of an LED power switching circuit that enables dimming via pulse-width modulation. Current source 110 supplies current to LED 120, as well as to MOSFET switch 130. Turning the power switch 130 off and on, by making the voltage $V_G$ applied to the gate go low or high, controls the current to the LED 120. When the switch 130 is off, the current $I_{input}$ flows through the LED 120. When the switch 130 is on, the current $I_{input}$ flows through the switch 130, shunting the current away from the LED 120. Thus the dimming of the LED is controlled by the duty cycle of the gate control signal $V_G$.

It is desirable that this turning on and off of the power switch 130 be soft in order reduce electromagnetic emissions. Hard edges in the gate control signal $V_G$ and in the current $I_{LED}$ through the LED 120 cause unwanted frequency harmonics. Various applications have different electromagnetic interference standards that must be complied with, so it is desirable to regulate the rate of change of the gate control signal voltage $V_G$ and the rate of change of the LED current.

Conventionally, a slew rate controlled gate driver circuit is used to drive the power switch 130 in order to achieve soft turn on and soft turn off. FIG. 2 is a circuit diagram of a conventional slew rate controlled gate driver circuit 200. The slew rate controlled gate driver circuit 200 includes a PMOS transistor S3 210 and an NMOS transistor S4 220. The gates of S3 210 and S4 220 are coupled together to receive a control pulse $V_{CTRL}$. The drains of S3 210 and S4 220 are coupled together to provide a gate control signal $V_G$. This gate control signal $V_G$ can be provided to the gate of switch 130 of FIG. 1 to control the switch turn on/off. Slew rate control is provided by the current sources I1 230 and I2 240. Current source I1 230 controls the rise rate of gate control signal $V_G$, and current source I2 240 controls the fall rate of $V_G$. The rise rate of $V_G$ is dependent upon the capacitance of the gate of switch S3 210 and the value of current I1. Similarly, the fall rate of $V_G$ is dependent upon the capacitance of the gate of switch S4 220 and the value of current I2. Thus I1 and I2 are selected to provide the desired rise and fall rates of gate control signal $V_G$. This can also be implemented using resistors in place of I1 and I2 or using a resistor in series with the gate control signal $V_G$. While the gate driver circuit 200 regulates the slew rate of the gate control signal $V_G$, thus achieving soft turn on/off of the switch 130, it causes a stretching of the current pulse in the LED 120, resulting in a difference between the input pulse and the actual duration for which the LED 130 is on, as will be described below with respect to FIG. 3.

FIG. 3 is a timing chart showing the relationship between the input control pulse $V_{CTRL}$ provided to the gate driver circuit 200, the gate control signal $V_G$, and the current $I_{LED}$ through the LED 120. Following the fall 310 of the $V_{CTRL}$ input, the gate voltage $V_G$ rises slowly, at a controlled slew rate. The rate of the rise of $V_G$ is controlled by current source I1 230. As the gate control signal $V_G$ rises above the on/off threshold $V_{TH}$ of the power switch 130 at point 320, the switch 130 starts conducting and the current $I_{LED}$ in the LED 120 begins dropping as more of the current $I_{input}$ flows into the switch 130. When $I_{LED}$ drops to zero (at point 330) and the switch current peaks, the drain-to-source voltage $V_{DS}$ across the switch 130 starts dropping. During the time that $V_{DS}$ is discharging, the gate control signal $V_G$ stays flat. This is known as the Miller plateau and is shown in FIG. 3 at 340. At point 350, $V_G$ starts rising again once $V_{DS}$ has dropped to its minimum value, turning the switch 130 fully on. During turn-off of the switch 130, the operation is reversed, and current source I2 240 controls the rate of fall of gate control signal $V_G$.

Thus it can be seen that the conventional slew rate controlled gate driver circuit, such as gate driver circuit 200, causes a stretching of the current pulse in the LED, resulting in a substantial difference between the input pulse $V_{CTRL}$ and the actual duration for which the LED is on. Because very small duration pulses cannot be achieved, there is loss of dimming resolution.

SUMMARY

One embodiment of the present invention is directed to an electronic circuit having a slew rate controlled transistor driver circuit. The slew rate controlled transistor driver circuit is operable to drive a transistor. The slew rate controlled transistor driver circuit generates a transistor driver signal that, when rising, rises substantially in step fashion until reaching a first threshold voltage level, whereupon the transistor driver signal rises at a controlled slew rate. When the transistor driver signal rises beyond a second threshold voltage level that is greater than the first threshold voltage level, the transistor driver signal again rises substantially in step fashion.

One embodiment of the invention is directed to a slew rate controlled gate driver circuit. The gate driver circuit generates a gate control signal that rises substantially in step fashion until reaching a first threshold voltage level, whereupon the transistor driver signal rises at a controlled slew rate. When the gate control signal rises beyond a second threshold voltage level that is greater than the first threshold voltage level, the gate control signal again rises substantially in step fashion.

In one embodiment of the invention, the slew rate controlled gate driver circuit maintains a first threshold voltage level and a second threshold voltage level that is greater than the first threshold voltage level. The gate driver circuit is configured to generate a gate control signal that falls substantially in step fashion until reaching the second threshold voltage level, wherein after the gate control signal falls to the second threshold voltage level, the gate control signal falls at a controlled slew rate until reaching the first threshold voltage level, whereupon the gate control signal falls substantially in step fashion.

Another embodiment of the invention is directed to a slew rate controlled gate driver circuit comprising first and second field effect transistors, a current source, a switch, and control logic. The gates of the first and second field effect transistors coupled together to receive a control pulse input, and the drains of the first and second field effect transistors coupled together to provide a gate control signal. The current source is coupled to supply current to the source of the first field effect transistor. The switch is coupled to the source of the first field effect transistor in parallel to the current source. The control logic is coupled to receive the gate control signal and to provide a switch control signal to the switch. The control logic maintains a first threshold voltage level and a second threshold voltage level that is greater than the first threshold voltage level. If the voltage of the gate control signal is less than the first and second threshold voltage levels, the switch control signal turns the switch on. If the voltage of the gate control signal is greater than the first threshold voltage level but less than the second threshold voltage level, the switch control signal turns the switch off. If the voltage of the gate control signal is greater than the first and second threshold voltage levels, the switch control signal turns the switch on.

DETAILED DESCRIPTION

The present invention provides soft turn-on and turn-off of the transistor being driven while minimizing the stretching of the gate control signal $V_G$ and the consequent stretching of the current pulse provided to the LED. In the illustrative description of the invention that follows, the transistor being driven is a metal-oxide-semiconductor field-effect transistor (MOS-FET). However, it will be appreciated that the present invention is also applicable to driving other types of field-effect transistors, including junction field-effect transistors (JFETs), as well as to other, non-field-effect transistors, including bipolar transistors.

Figure 4:
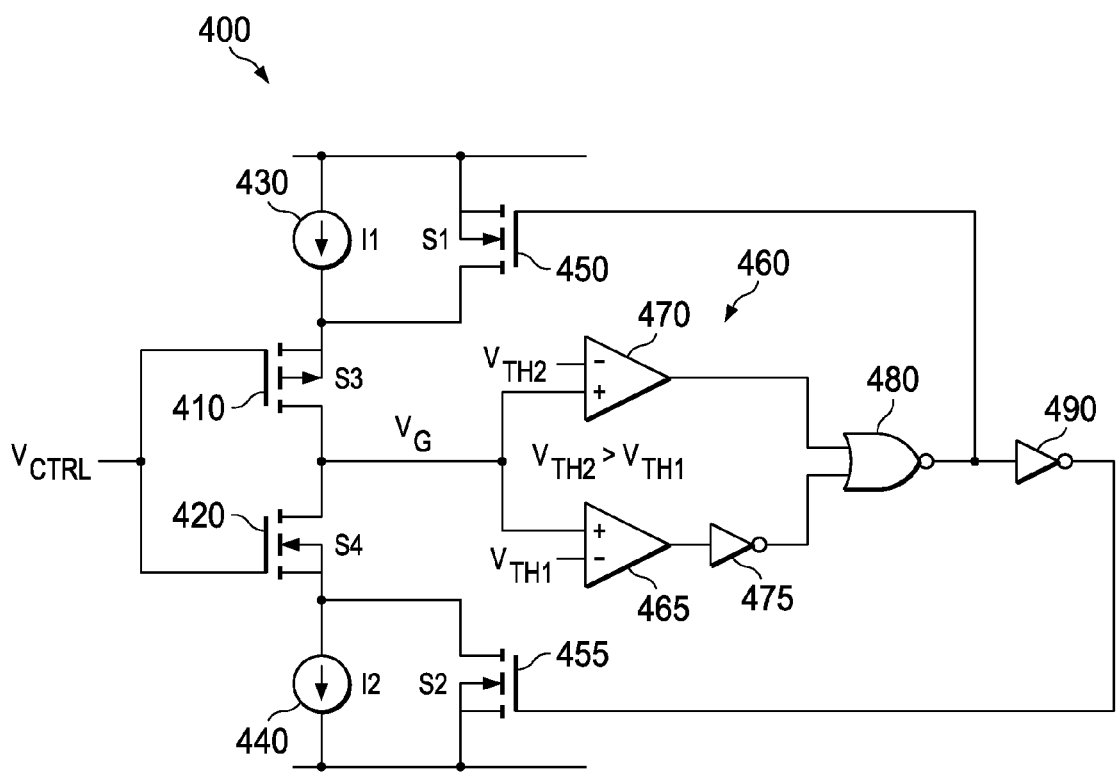
FIG. 4 is a circuit diagram of a slew rate controlled gate driver circuit in accordance with an illustrative embodiment of the present invention.

FIG. 4 is a circuit diagram of a slew rate controlled gate driver circuit in accordance with an illustrative embodiment of the present invention. The slew rate controlled gate driver circuit 400 includes a PMOS transistor S3 410 and an NMOS transistor S4 420. The gates of S3 410 and S4 420 are coupled together to receive a control pulse $V_{CTRL}$. The drains of S3 410 and S4 420 are coupled together to provide a gate control signal $V_G$. This gate control signal $V_G$ can be provided to the gate of a switch such as switch 130 of FIG. 1 to control the switch turn on/off. The switch being controlled by the gate control signal $V_G$ is not shown in FIG. 4. Slew rate control is provided by the current sources I1 430 and I2 440. The slew rate controlled gate driver circuit 400 further includes PMOS transistor S1 450 and an NMOS transistor S2 455, as well as control logic 460. The control logic 460 controls the switches 450 and 455 based on the relationship of the gate control signal to two threshold voltage levels, $V_{TH1}$ and $V_{TH2}$. The first threshold voltage $V_{TH1}$ is less than the second threshold voltage $V_{TH2}$, and both $V_{TH1}$ and $V_{TH2}$ are greater than the "low" value of the gate control signal $V_G$, but less than the "high" value of $V_G$. More detail will be provided below regarding the selection of the voltage thresholds $V_{TH1}$ and $V_{TH2}$. In the illustrative embodiment of FIG. 4, the control logic 460 includes comparators 465 and 470, inverter 475, NOR gate 480 and inverter 490.

Figure 1:
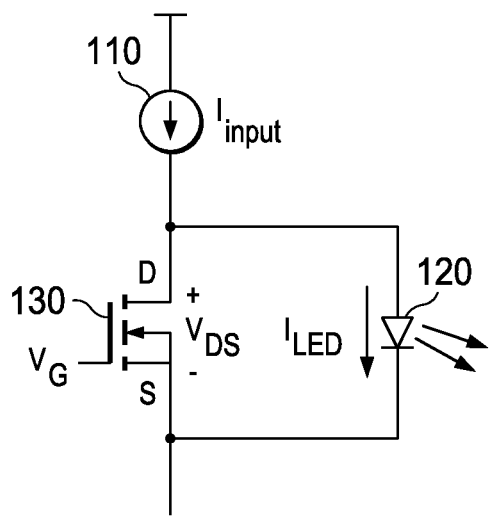
FIG. 1 is a circuit diagram of a conventional LED power switching circuit that enables dimming via pulse-width modulation.
Figure 5:
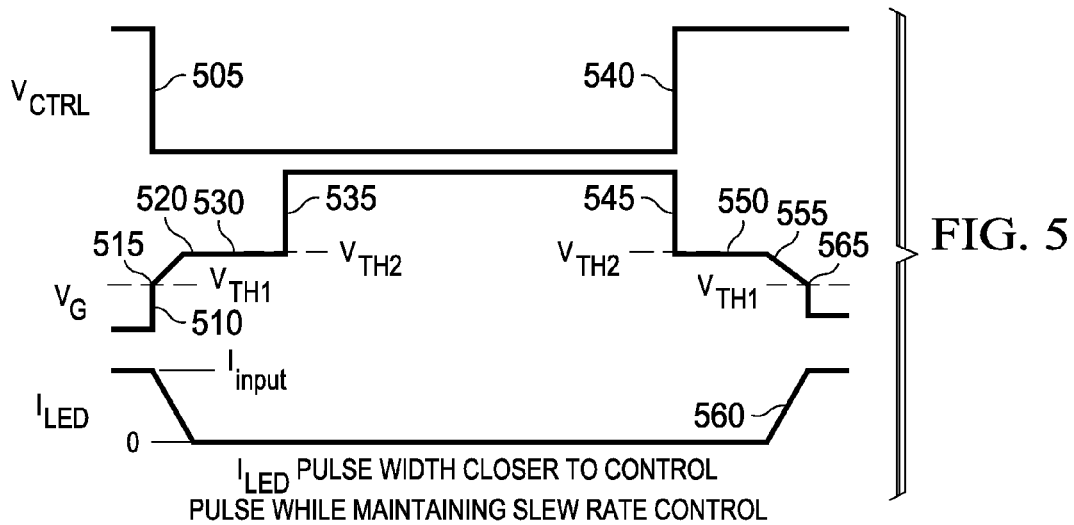
FIG. 5 is a timing chart showing the relationship between the input control pulse provided to the gate driver circuit of FIG. 4, the gate control signal, and the current through an LED being driven.

Operation of the slew rate controlled gate driver circuit 400 will be described with respect to FIG. 5. FIG. 5 is a timing chart showing the relationship between the input control pulse $V_{CTRL}$ provided to the gate driver circuit 400, the gate control signal $V_G$, and the current $I_{LED}$ through an LED being driven, such as LED 120 of FIG. 1. Assume initially that the input control signal $V_{CTRL}$ is high, the gate control signal $V_G$ is low, and the transistor being driven, e.g., the NMOS power switch 130 of FIG. 1, is in an "off" state. In this initial state, $V_{TH2} > V_{TH1} > V_G$. Since $V_{TH1} > V_G$, the output of comparator 465 is a logical "0" and the output of the inverter 475 is a logical "1." Since $V_{TH2} > V_G$, the output of comparator 470 is a logical "0." Since the inputs to NOR gate 480 are "0" and "1," the output of the NOR gate 480 is a logical "0," turning the PMOS switch S1 450 on. As the input control pulse $V_{CTRL}$ changes from high to low (shown in FIG. 5 at 505), NMOS switch S4 420 is turned off and PMOS switch S3 410 is turned on. Since PMOS switch S1 450 is on, the gate control signal VG is pulled up quickly, substantially in step fashion, as shown at 510.

When the gate control signal $V_G$ rises above the first threshold voltage $V_{TH1}$ (shown in FIG. 5 at 515), the output of comparator 465 becomes a logical "1" and the output of the inverter 475 becomes a logical "0." Since $V_G$ is still less than the second threshold voltage $V_{TH2}$, the output of comparator 470 is a logical "0." Since the inputs to NOR gate 480 are "0" and "0," the output of the NOR gate 480 becomes a logical "1," turning the PMOS switch S1 450 off. With the switch S1 450 turned off, the current source I1 430 begins to charge the gate control signal $V_G$ slowly, at a controlled slew rate, as shown at 520 in FIG. 5. The rate of the rise of $V_G$ here is controlled by current source I1 430. As $V_G$ rises in this controlled manner, $V_G$ passes the on/off threshold $V_{TH}$ of the power switch 130 being driven and the switch 130 is turned on softly. Once the on/off threshold $V_{TH}$ of the power switch 130 is crossed, current starts to ramp up through the switch 130 at a controlled rate, in turn causing the current $I_{LED}$ through the LED 120 to drop at a controlled rate, as shown at 525 in FIG. 5.

When $I_{LED}$ drops to zero and the switch current peaks, the drain-to-source voltage $V_{DS}$ across the switch 130 starts dropping and the gate control signal $V_G$ goes through the Miller plateau 530. Once $V_{DS}$ has dropped to its minimum value, turning the switch 130 fully on, $V_G$ starts rising again. When the gate control signal $V_G$ rises above the second threshold voltage $V_{TH2}$, the output of comparator 470 becomes a logical "1." Since $V_G$ is still greater than the first threshold voltage $V_{TH1}$, the output of comparator 465 is a logical "1" and the output of the inverter 475 is a logical "0." Thus the output of the NOR gate 480 becomes a logical "0," turning the PMOS switch S1 450 on. With PMOS switch S1 450 being "on," the gate control signal VG is pulled up quickly, substantially in step fashion (as shown at 5), all the way to the upper rail to achieve a low-resistance "on" condition of the switch 130. Also, with the output of NOR gate 480 being a logical "0," the inverter 490 provides a logical "1" to NMOS switch S2 455, turning S2 455 on.

Thus it can be seen that, during switch-on transition, the slew rate of the gate control signal $V_G$ is controlled when $V_G$ is greater than the first threshold voltage $V_{TH1}$ but less than the second threshold voltage $V_{TH2}$. Conversely, when the gate control signal $V_G$ is less than the first threshold voltage $V_{TH1}$, or greater than the second threshold voltage $V_{TH2}$, the gate control signal $V_G$ is charged quickly. Thus the gate control signal $V_G$ charges in a controlled manner from the on/off threshold of the switch 130 being driven to the end of the Miller plateau 530. During all other stages of the switch-on transition, the gate control signal $V_G$ charges quickly. Since the slew rate of the gate control signal $V_G$ is controlled during the interval from the turn-on threshold of the switch 130 being driven until the start of the Miller plateau (region 520 of FIG. 5), the slew rate of the current $I_{LED}$ through the LED 120 during this time period is also controlled as it ramps down (region 525 of FIG. 5).

Switch-off transition is opposite to switch-on transition. Referring again to FIG. 5, when the control pulse $V_{CTRL}$ changes from low to high (shown in FIG. 5 at 540), PMOS switch S3 410 is turned off and NMOS switch S4 420 is turned on. Since NMOS switch S2 455 is on, it pulls the gate control signal $V_G$ down quickly, substantially in step fashion, as shown in FIG. 5 at 545. As $V_G$ falls below the second threshold voltage $V_{TH2}$, the output of comparator 470 becomes a logical "0." Since $V_G$ is still greater than the first threshold voltage $V_{TH1}$, the output of comparator 465 is a logical "1" and the output of the inverter 475 is a logical "0." Thus the output of the NOR gate 480 becomes a logical "1," and the output of the inverter 490 becomes a logical "0," turning the NMOS switch S2 455 off. With switch S2 455 turned off, the current source I2 440 starts to slowly discharge the gate of the power switch 130 being driven. During this time (the Miller plateau 550), the gate control signal $V_G$ remains substantially constant. At the end of the Miller plateau 550, the gate control signal $V_G$ starts falling at a controlled slew rate, as shown at 555 in FIG. 5. The rate of decline of $V_G$ here is controlled by the current source I2 440. As $V_G$ falls in this controlled manner, $V_G$ passes the on/off threshold $V_{TH}$ of the power switch 130 being driven and the switch 130 is turned off softly. When the power switch 130 is turned off, the current $I_{LED}$ through the LED 120 starts to rise at a controlled rate, as shown at 560 in FIG. 5.

When the gate control signal $V_G$ falls below the first threshold voltage $V_{TH1}$ (shown in FIG. 5 at 565), the output of comparator 465 becomes a logical "0" and the output of the inverter 475 becomes a logical "1." Since $V_G$ is still less than the second threshold voltage $V_{TH2}$, the output of comparator 470 is a logical "0." Thus the output of the NOR gate 480 becomes a logical "0," and the output of the inverter 490 becomes a logical "1," turning the NMOS switch S2 455 on. With switch S2 455 turned on, the gate control signal $V_G$ is pulled down, substantially in step fashion, to the lower rail to completely shut off the switch 130 being driven.

Thus it can be seen that, during switch-off transition, the slew rate of the gate control signal $V_G$ is controlled when $V_G$ is less than the second threshold voltage $V_{TH2}$ but greater than the first threshold voltage $V_{TH1}$. Conversely, when the gate control signal $V_G$ is greater than the second threshold voltage $V_{TH2}$, or less than the first threshold voltage $V_{TH1}$, the gate control signal $V_G$ is discharged quickly. Thus the gate control signal $V_G$ discharges in a controlled manner from the beginning of the Miller plateau 550 to the on/off threshold of the switch 130 being driven. During all other stages of the switch-off transition, the gate control signal $V_G$ discharges quickly. Since the slew rate of the gate control signal $V_G$ is controlled during the interval from the end of the Miller plateau until the turn-off threshold of the switch 130 being driven (region 555 of FIG. 5), the slew rate of the current $I_{LED}$ through the LED 120 during this time period is also controlled as it ramps up (region 560 of FIG. 5).

Figure 2:
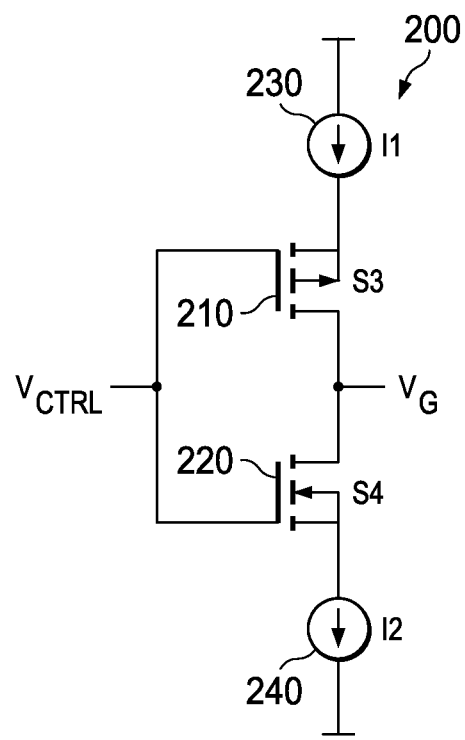
FIG. 2 is a circuit diagram of a conventional slew rate controlled gate driver circuit.
Figure 3:
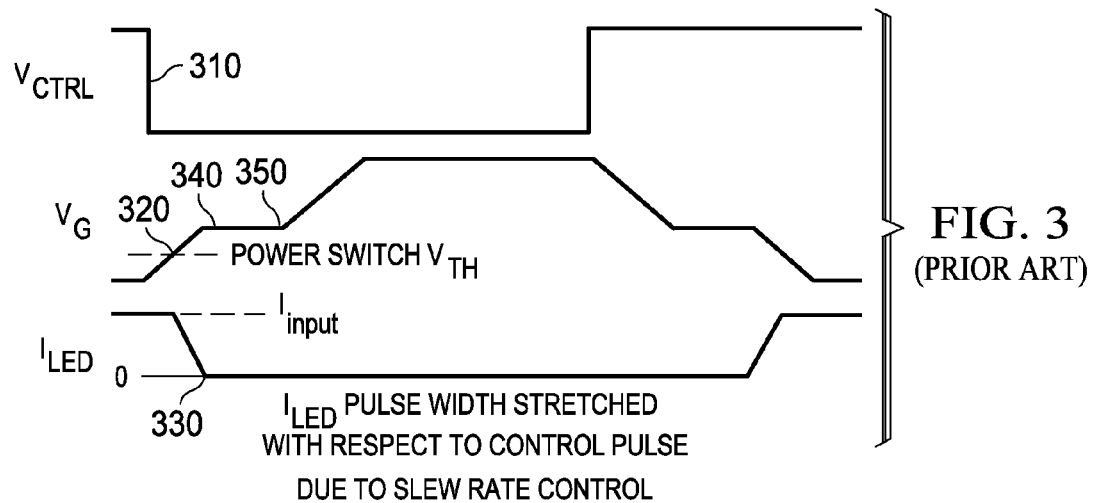
FIG. 3 is a timing chart showing the relationship between the input control pulse provided to the gate driver circuit of FIG. 2, the gate control signal, and the current through the LED of FIG. 1.

Because the charge/discharge rate of the gate control signal $V_G$ is controlled (slowed down) only when necessary, i.e., when the current $I_{LED}$ through the LED 120 is ramping up or down, and is fast at all other times, the pulse width of $I_{LED}$ is much less distorted with respect to the control pulse $V_{CTRL}$ compared to the prior art solution exemplified by FIGS. 2 and 3, while maintaining the same slew rate control. This is especially true at low pulse widths. Hence, higher dimming resolutions (narrower pulse widths) can be achieved.

Current source I1 430 can be set to achieve the desired slew rate of the gate control signal $V_G$ in region 520 of FIG. 5. Similarly, current source I2 440 can be set to achieve the desired slew rate of the gate control signal $V_G$ in region 555. The rise rate of $V_G$ in region 520 is dependent upon the capacitance of the gate of switch S3 410 and the value of current I1. Similarly, the fall rate of $V_G$ in region 555 is dependent upon the capacitance of the gate of switch S4 420 and the value of current I2. Thus I1 and I2 are selected to provide the desired rise and fall rates of gate control signal $V_G$. In an alternative embodiment, switches S1 450 and S2 455 can be replaced with controlled current sources (with values higher than I1 and I2) to achieve smooth transition.

The threshold voltage levels $V_{TH1}$ and $V_{TH2}$ are selected based on switch size and switch current such that the on/off threshold of the switch 130 being driven is between the first threshold voltage level $V_{TH1}$ and the second threshold voltage level $V_{TH2}$. In an alternative embodiment, the first threshold voltage $V_{TH1}$ is set to be equal to the on/off threshold of the switch being driven. In the illustrative embodiment represented in the timing chart of FIG. 5, the first threshold voltage $V_{TH1}$ is set to be approximately equal to or slightly less than the on/off threshold of the switch 130 being driven. The comparators 465 and 470 can be implemented using CMOS inverters with source degeneration.

Figure 6:
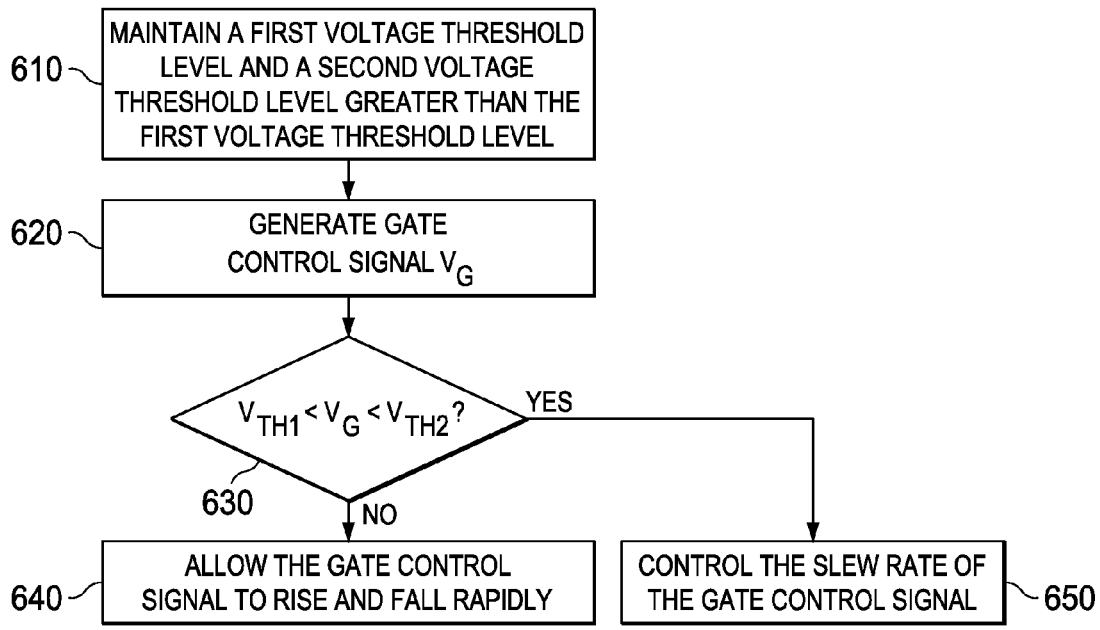
FIG. 6 is a flow chart representing a method of driving a gate of a field effect transistor in accordance with an illustrative embodiment of the present invention.

FIG. 6 is a flow chart representing a method of driving a gate of a field effect transistor in accordance with an illustrative embodiment of the present invention. As indicated by block 610, first and second voltage threshold levels are maintained, wherein the first voltage threshold level $V_{TH1}$ is less than the second voltage threshold level $V_{TH2}$. At block 620, a gate control signal $V_G$ is generated in response to an input control pulse such as input control pulse $V_{CTRL}$ of FIGS. 4 and 5. At decision block 630, it is determined whether the gate control signal $V_G$ is between the two voltage threshold levels. If it is, the slew rate of the gate control signal $V_G$ is controlled such that the gate of the transistor being driven is driven softly, as indicated by block 650. If, on the other hand, the gate control signal $V_G$ is less than the first voltage threshold level $V_{TH1}$ or greater than the second voltage threshold level $V_{TH2}$, the gate of the transistor being driven is driven hard, as indicated by block 640. By "driven hard," it is meant that the gate control signal $V_G$ is allowed to rise or fall rapidly in response to the input control pulse $V_{CTRL}$ without controlling its slew rate. In one embodiment of the invention, the first voltage threshold level $V_{TH1}$ is set such that the on/off threshold of the transistor being driven is greater than or equal to the first voltage threshold level $V_{TH1}$. The second voltage threshold level $V_{TH2}$ is set such that the on/off threshold of the transistor being driven is less than the second voltage threshold level $V_{TH2}$. Thus when the transistor being driven is transitioning from off to on, or from on to off, the slew rate of the gate control signal $V_G$ is controlled such that the gate of the transistor being driven is driven softly, thereby minimizing harmonics. At all other times, the gate control signal $V_G$ rises and falls rapidly so as to minimize the stretching of the gate control signal $V_G$ relative to the input control pulse $V_{CTRL}$.

In the above illustrative description of the invention, the transistor being driven is a MOSFET. However, as previously mentioned, the present invention is also applicable to driving other types of field-effect transistors, including JFETs, as well as to other, non-field-effect transistors, including bipolar transistors. As applied to the driving of a bipolar transistor, the transistor driving circuit of the present invention is operable to drive a bipolar transistor by providing a base control signal to the base of the bipolar transistor, in a manner similar to the provision of a gate control signal to the gate of a field-effect transistor, as described above with reference to FIGS. 1-6.

Having thus described a slew rate controlled gate driver by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. For example, while the gate driver circuit of the present invention is described herein with respect to driving LED lighting circuits, it will be appreciated by those of skill in the art that the gate driver circuit described herein will have utility in any application of a field effect transistor where it is desirable to maximize the fidelity of a gate control signal relative to an input control signal and to minimize signal harmonics. Accordingly, it is appropriate that the appended claims be construed broadly and in a manner consistent with the broad inventive concepts disclosed herein.

What is claimed is:

1. An electronic circuit comprising:
a slew rate controlled transistor driver circuit operable to drive a transistor and configured to generate a transistor driver signal that rises substantially in step fashion until reaching a first threshold voltage level, whereupon the transistor driver signal rises at a controlled slew rate, comprising a slew rate controlled gate driver circuit operable to drive a gate of a field effect transistor and configured to generate a gate control signal that rises substantially in step fashion until reaching a first threshold voltage level, whereupon the gate control signal rises at a controlled slew rate;
further comprising an LED dimmer circuit comprising:
a field effect transistor whose gate is coupled to receive the gate control signal from the slew rate controlled gate driver circuit;
a light emitting diode whose anode is coupled to the drain of the field effect transistor and whose cathode is coupled to the source of the field effect transistor; and
a current source coupled to supply current to the drain of the field effect transistor and the anode of the light emitting diode.

2. The electronic circuit of claim 1, wherein after rising to a second threshold voltage level that is greater than the first threshold voltage level, the gate control signal rises substantially in step fashion.

3. The electronic circuit of claim 2, wherein after rising to the first threshold voltage level, the gate control signal rises at a controlled slew rate until reaching a Miller plateau level, and wherein the gate control signal begins rising again as the switch-on transition of the field effect transistor ends.

4. The electronic circuit of claim 2, wherein the gate control signal falls substantially in step fashion until reaching the second threshold voltage level, and wherein after the gate control signal falls to the second threshold voltage level, the gate control signal falls at a controlled slew rate until reaching the first threshold voltage level, whereupon the gate control signal falls substantially in step fashion.

5. The electronic circuit of claim 4, wherein after falling to the second threshold voltage level, the gate control signal falls to a Miller plateau level and remains at the Miller plateau level until a drain-to-source voltage of the field effect transistor reaches its maximum value, whereupon the gate control signal falls at a controlled slew rate until reaching the first threshold voltage level.

6. The electronic circuit of claim 1, wherein the first threshold voltage level is equal to or lower than an on/off threshold voltage of the transistor.

7. An LED lighting device comprising:
a slew rate controlled gate driver circuit operable to drive a gate of a field-effect transistor, the slew rate controlled gate driver circuit maintaining a first threshold voltage level and a second threshold voltage level that is greater than the first threshold voltage level, wherein the slew rate controlled gate driver circuit is configured to generate a gate control signal that falls substantially in step fashion until reaching the second threshold voltage level, wherein after the gate control signal falls to the second threshold voltage level, the gate control signal falls at a controlled slew rate until reaching the first threshold voltage level, whereupon the gate control signal falls substantially in step fashion;
a field effect transistor whose gate is coupled to receive the gate control signal from the slew rate controlled gate driver circuit;
a light emitting diode whose anode is coupled to the drain of the field effect transistor and whose cathode is coupled to the source of the field effect transistor; and
a current source coupled to supply current to the drain of the field effect transistor and the anode of the light emitting diode.

8. The electronic circuit of claim 7, wherein after falling to the second threshold voltage level, the gate control signal falls to a Miller plateau level and remains at the Miller plateau level until a drain-to-source voltage of the field effect transistor reaches its maximum value, whereupon the gate control signal falls at a controlled slew rate until reaching the first threshold voltage level.

9. The electronic circuit of claim 7, wherein the first threshold voltage level is equal to or lower than an on/off threshold voltage of the field effect transistor.

10. The electronic circuit of claim 7, wherein the slew rate controlled gate driver circuit is configured to generate the gate control signal in response to a control pulse input, and wherein the gate control signal falls substantially in step fashion in response to a transition of the control pulse input until reaching the second threshold voltage level.

11. A slew rate controlled gate driver circuit comprising:
first and second field effect transistors, the gates of the first and second field effect transistors coupled together to receive a control pulse input, the drains of the first and second field effect transistors coupled together to provide a gate control signal;
a current source coupled to supply current to the source of the first field effect transistor;
a switch coupled to the source of the first field effect transistor in parallel to the current source; and
control logic coupled to receive the gate control signal and to provide a switch control signal to the switch, wherein the control logic maintains a first threshold voltage level and a second threshold voltage level that is greater than the first threshold voltage level, and wherein if the voltage of the gate control signal is less than the first and second threshold voltage levels, the switch control signal turns the switch on, wherein if the voltage of the gate control signal is greater than the first threshold voltage level but less than the second threshold voltage level, the switch control signal turns the switch off, and wherein if the voltage of the gate control signal is greater than the first and second threshold voltage levels, the switch control signal turns the switch on.

12. The slew rate controlled gate driver circuit of claim 11, wherein the gate control signal is coupled to drive a gate of a field effect transistor, and wherein the first threshold voltage level is equal to or lower than an on/off threshold voltage of the field effect transistor being driven.

13. The slew rate controlled gate driver circuit of claim 11, wherein the switch comprises a third field effect transistor whose drain is coupled to the source of the first field effect transistor and whose gate is coupled to receive the switch control signal from the control logic.

14. The slew rate controlled gate driver circuit of claim 13, wherein the first field effect transistor comprises a PMOS transistor, the second field effect transistor comprises an NMOS transistor, and the third field effect transistor comprises a PMOS transistor.

15. The slew rate controlled gate driver circuit of claim 14, wherein the control logic comprises:
a first comparator coupled to receive the gate control signal at its positive input terminal and coupled to receive the first threshold voltage level at its negative terminal;
a second comparator coupled to receive the gate control signal at its positive input terminal and coupled to receive the second threshold voltage level at its negative terminal;
an inverter coupled to receive the output of the first comparator; and
a NOR gate coupled to receive the output of the inverter at a first input terminal and the output of the second comparator at a second input terminal, and whose output is provided as the switch control signal to the gate of the third field effect transistor.

16. The slew rate controlled gate driver circuit of claim 11, further comprising:
a second current source coupled to supply current to the source of the second field effect transistor; and
a second switch coupled to the source of the second field effect transistor in parallel to the second current source;
wherein the control logic is coupled to provide a second switch control signal to the second switch, wherein if the voltage of the gate control signal is less than the first and second threshold voltage levels, the second switch control signal turns the second switch on, wherein if the voltage of the gate control signal is greater than the first threshold voltage level but less than the second threshold voltage level, the second switch control signal turns the second switch off, and wherein if the voltage of the gate control signal is greater than the first and second threshold voltage levels, the second switch control signal turns the second switch on.

17. The slew rate controlled gate driver circuit of claim 16, wherein the second switch comprises a fourth field effect transistor whose drain is coupled to the source of the second field effect transistor and whose gate is coupled to receive the second switch control signal from the control logic.

18. The slew rate controlled gate driver circuit of claim 17, wherein the first field effect transistor comprises a PMOS transistor, the second field effect transistor comprises an NMOS transistor, the third field effect transistor comprises a PMOS transistor, and the fourth field effect transistor comprises an NMOS transistor, and wherein the control logic comprises:
a first comparator coupled to receive the gate control signal at its positive input terminal and coupled to receive the first threshold voltage level at its negative terminal;
a second comparator coupled to receive the gate control signal at its positive input terminal and coupled to receive the second threshold voltage level at its negative terminal;
a first inverter coupled to receive the output of the first comparator;
a NOR gate coupled to receive the output of the first inverter at a first input terminal and the output of the second comparator at a second input terminal, and whose output is provided as the switch control signal to the switch; and
a second inverter coupled to receive the output of the NOR gate and whose output is provided as the switch control signal to the gate of the fourth field effect transistor.

* * * * *